United States Patent [19]

Lindquist et al.

[11] Patent Number: 5,712,637
[45] Date of Patent: Jan. 27, 1998

[54] SLOPE, DRIFT AND OFFSET COMPENSATION IN ZERO-IF RECEIVERS

[75] Inventors: Björn Lindquist, Bjärred; Paul W. Dent, Stehag, both of Sweden

[73] Assignee: Ericsson Inc., Research Triangle Park, N.C.

[21] Appl. No.: 686,399

[22] Filed: Jul. 25, 1996

Related U.S. Application Data

[62] Division of Ser. No. 401,127, Mar. 9, 1995, Pat. No. 5,568,520.
[51] Int. Cl.⁶ ........................................ H03M 1/12
[52] U.S. Cl. .......................................... 341/155
[58] Field of Search ............................ 341/126, 143, 341/155

[56] References Cited

U.S. PATENT DOCUMENTS

| | | |
|---|---|---|
| 4,729,110 | 3/1988 | Welles et al. . |
| 5,136,616 | 8/1992 | Dent . |
| 5,204,878 | 4/1993 | Larsson . |
| 5,241,702 | 8/1993 | Dent . |

FOREIGN PATENT DOCUMENTS

| | | |
|---|---|---|
| 343 273 | 11/1989 | European Pat. Off. . |
| 594 894 | 5/1994 | European Pat. Off. . |
| 2 267 629 | 12/1993 | United Kingdom . |

OTHER PUBLICATIONS

B. Lindquist et al., "A New Approach to Eliminate the DC Offset in a TDMA Direct Conversion Receiver," *Personal Communication—Freedom Through Wireless Technology*, Secaucus, NJ pp. 754–575, May 18–20, 1993.

*Primary Examiner*—Brian K. Young
*Attorney, Agent, or Firm*—Burns, Doane, Swecker & Mathis, L.L.P.

[57] ABSTRACT

A method for processing a signal modulated with information symbols to account for an additive offset and slope is disclosed. First, an initial estimate of offset and slope is made and hypotheses of all possible values of a sequence of one or more information symbols are then made. For each of said hypotheses, the associated data symbol sequence is used to make an improved estimate of offset and slope and the improved estimate of offset and slope are stored against each of the hypotheses. For each hypothesis, the improved estimate of offset and slope is used in calculating an expected signal value and a mismatch between a sample of the modulated signal and the expected value is computed. The hypotheses are then sequentially extended by one symbol, the slope and offset estimates arc updated and the mismatches are accumulated to form a path metric value for each extended hypothesis, and resolving between said hypotheses based on said path metric values using a Viterbi Sequential Maximum Likelihood Sequence Estimation process to produce a most likely hypothesis of said modulated information symbols substantially unimpaired by said additive slope and offset.

4 Claims, 4 Drawing Sheets

FIG. 3

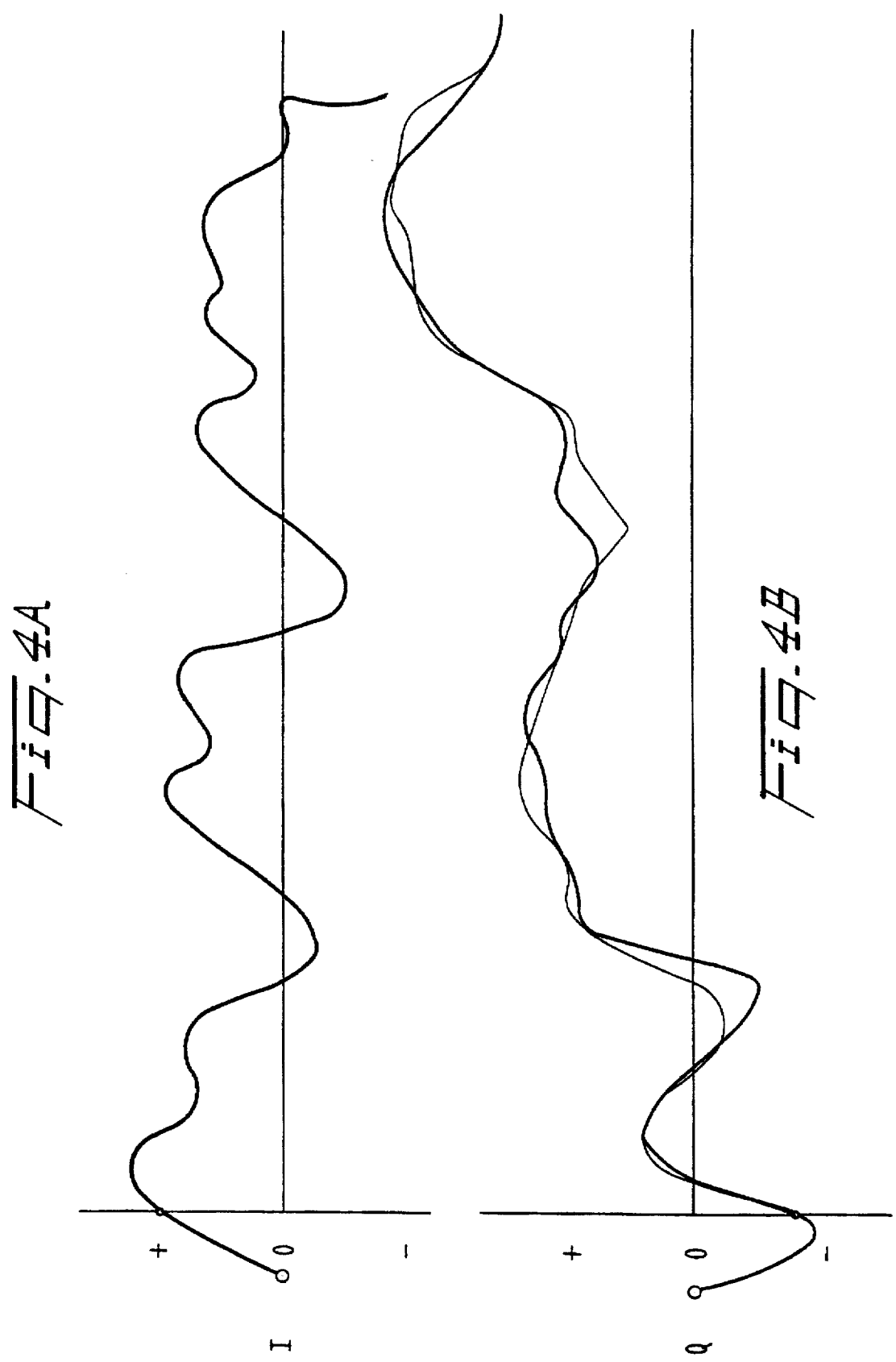

5,712,637

SLOPE, DRIFT AND OFFSET COMPENSATION IN ZERO-IF RECEIVERS

This application is a divisional of application No. 08/401, 127, now U.S. Pat. No. 5,568,520, filed Mar. 9, 1995.

FIELD OF THE DISCLOSURE

The present invention relates to radio receivers and more particularly to compensating radio receivers that are a special case of superheterodyne receivers having an intermediate frequency of zero.

BACKGROUND OF THE DISCLOSURE

In the field of radio receivers, there has been a concentrated effort to reduce the amount of tuned circuitry used in the receivers. By reducing the number of tuned circuits, large portions of the receiver can be integrated resulting in smaller receivers. These compact receivers can then be used in many areas such as cellular telephones. A major advance in the design of such receivers is a technique known as the "zero-IF" technique.

According to theory, an IQ radio receiver can be constructed according to FIG. 1, in which the radio signal S from the antenna 1 is applied directly to two balanced, quadrature mixers 2a, 2b (mathematically-multiplying devices) where the signal is multiplied respectively by a sine and cosine wave at the carrier frequency of signal S generated by a local oscillator 3. In this manner, the I-channel or in-phase signal and the Q-channel or quadrature signal are generated. The multiplication devices yield outputs containing both sum frequency components around 2f and difference frequency components around zero frequency. DC or low pass filters 4a, 4b eliminate the former and accept the latter. The zero frequency components can then be amplified to any convenient level by low-frequency amplifying stages 5a, 5b instead of high frequency amplifiers. Essentially, the zero-IF receiver eliminates the interim conversion to an intermediate frequency by converting the incoming signal directly to baseband in a single operation.

In practice, this so-called zero-IF approach is beset with a variety of practical problems, one of which concerns the imperfection of the balanced mixers as compared to perfect mathematical multipliers. The most troublesome aspect of this imperfection is the generation of a DC offset or standing voltage that can be many orders of magnitude greater than the desired signal. The low frequency amplifiers, which receive the mixer outputs, can be forced into saturation by the large DC offset long before the desired signal has been amplified sufficiently.

To avoid premature saturation, RF amplifers can be added ahead of the mixers to raise the desired signal voltage level. Unfortunately, a common source of the offset is leakage from the local sinusoidal oscillator back to the antenna, producing coherent interference. As a result, RF amplification is not a satisfactory solution because the desired signal and coherent interference are amplified equally.

Another proposed solution used in conventional superheterodyne radio receivers is partial amplification of the input signal at the original antenna frequency. The partially amplified signal is then convened to a convenient intermediate frequency IF for further amplification before being applied to the balanced quadrature mixers. In this situation, the locally generated sine and cosine waves are at the IF rather than the antenna frequency, so leakage back to the antenna is of no consequence. However, by adding IF tuning circuitry, the simplicity and reduced size of the zero-IF receiver are lost. An alternative method of overcoming DC offset from the IQ mixers may employ the technique variously called AC coupling, DC blocking, high-pass filtering or differentiation to eliminate the standing or DC offset voltage. The trade-off with this method is the result that the DC and low-frequency components are lost or gravely distorted. This trade-off is unacceptable in digital transmission systems which use QPSK (Quadrature Phase Shift Keying) or MSK (Minimum Shift Keying) modulation techniques. These modulation techniques generate low frequency components that must be preserved.

U.S. Pat. No. 5,241,702 discloses a method of compensating for low frequency offset without losing or distorting the DC and low-frequency components of the desired signal. Initially, the received signal is differentiated to filter out the DC offset. The signal is amplified to a suitable level and then integrated to recapture the original DC and low frequency signal components. The integration essentially restores the filtered components to their original values in the amplified signal using an arbitrary constant of integration of bounded magnitude to generate a restored signal. Using various techniques that exploit predetermined signal patterns or inherent signal properties of the desired signal, the DC offset estimate is then subtracted out of the restored signal leaving the amplified, received signal substantially free from distortion. A preferred way of removing such unwanted DC offsets by means of digitizing the time derivatives of the I and Q waveforms will now be described. After digitizing the derivatives, the digital values are re-integrated in an I and a Q accumulator to restore the I,Q values. The m-integration process introduces arbitrary constants of integration into the I and Q values which are now however of comparable magnitude to the wanted signal and can be estimated and removed according to the aforementioned patent. Errors in the digitizing process can lead additionally to the re-integrated I and Q values exhibiting a systematic increase or decrease, and this unwanted slope is now removed at the same time as removing the unwanted arbitrary constants of re-integration by estimating both the constants and the slopes and subtracting these systematic errors from the I and Q waveforms respectively. The I and Q waveforms are then processed by numerical signal processing algorithms to demodulate and decode the information.

However, problems still remain even for the above identified methods. Rate of change of the DC offset or signal slope still causes problems. Therefore, it is desirable to provide a method for compensating for the rate of change or signal slope so that decoded information modulated on the radio input signal is substantially unimpaired.

SUMMARY OF THE DISCLOSURE

It is an object of the present invention to provide a method for compensating for the rate of change or signal slope so that decoded information modulated on the radio input signal is substantially unimpaired. A radio receiver according to one embodiment of the present invention receives a signal via an antenna and mixes it down to the complex baseband using a local reference oscillator. The complex baseband signal comprises a real part (I waveform) and an imaginary part (Q waveform) that are corrupted by DC offsets arising from mixer imperfections or from reference oscillator leakage radiation being received at the antenna as coherent self-interference.

According to one embodiment of the present invention, previously estimated errors are fed back to the digitization process to reduce errors in digitizing the derivatives of the I, Q signals. A preferred digitizing technique uses high bit-rate delta modulation with variable stepsize. The variable stepsize is obtained by switching positive and negative current sources of different current values to charge a principal integrator capacitor. Slope errors occur when a positive and negative current source pair do not produce equal current magnitudes. According to one embodiment of the present invention, the unequal current source values are compensated by using correspondingly unequal digital increment/decrement values that are applied to the re-integrating I,Q accumulators, the values being set by a calibration procedure or being updated by feedback calculated from the estimated slope errors.

According to one embodiment of the present invention, an improved radio receiving apparatus for direct conversion of signals to a baseband for processing is disclosed. The radio receiving apparatus comprises direct conversion means for converting a radio input signal to a complex baseband signal having a real waveform and an imaginary waveform. Slope and offset compensation means estimate offsets and systematic drifts in the real and imaginary waveforms and compensate for the drifts and offsets such that decoding of information modulated on the radio input signal is substantially unimpaired.

According to another embodiment of the present invention, an improved analog-to-digital conversion apparatus is disclosed. Comparator means compare an input signal voltage with a feedback voltage and generating a high/low indication at a regular repetition rate determined by a clock pulse train. A principal integrator means integrates a controlled current to generate the feedback voltage. Charge pump means produce said controlled current controlled in magnitude by a stepsize controller and in direction or sign in accordance with the high/low indication. Stepsize controller means controls said current magnitude in dependence on historical values of the high/low indications and produces a digital stepsize value indicative of the current magnitude generated by the charge pump for a positive-direction of current flow and a negative direction of current flow respectively. Accumulator means add or subtract the digital stepsize value to produce a series of accumulated digital values representative of the input signal voltage waveform.

According to one embodiment of the present invention, a method for processing a signal modulated with information symbols to account for an additive offset and slope is disclosed. First, an initial estimate of offset and slope is made and hypotheses of all possible values of a sequence of one or more information symbols are then made. For each of said hypotheses, the associated data symbol sequence is used to make an improved estimate of offset and slope and the improved estimate of offset and slope are stored against each of the hypotheses. For each hypothesis, the improved estimate of offset and slope is used in calculating an expected signal value and a mismatch between a sample of the modulated signal and the expected value is computed. The hypotheses are then sequentially extended by one symbol, the slope and offset estimates are updated and the mismatches are accumulated to form a path metric value for each extended hypothesis, and resolving between said hypotheses based on said path metric values using a Viterbi Sequential Maximum Likelihood Sequence Estimation process to produce a most likely hypothesis of said modulated information symbols substantially unimpaired by said additive slope and offset.

BRIEF DESCRIPTION OF THE DRAWINGS

These and other features and advantages of the invention will be readily apparent to one of ordinary skill in the art from the following written description, used in conjunction with the drawings, in which:

FIG. 4 illustrates slope compensation after A-to-D conversion of the I and Q waveforms.

DETAILED DESCRIPTION OF THE DISCLOSURE

Figure 1:
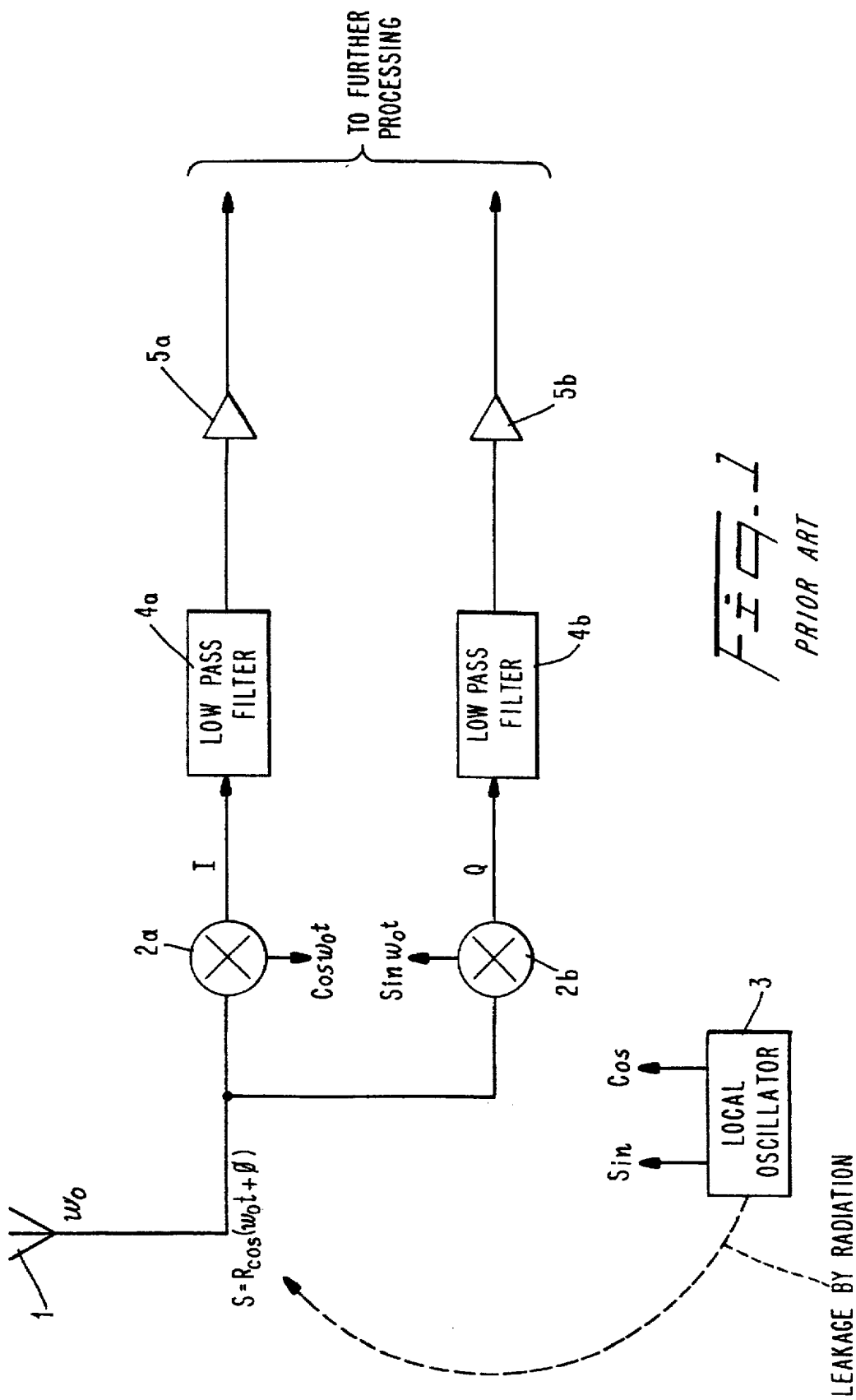
FIG. 1 illustrates a simple block diagram showing a prior art receiver using the zero-IF technique.
Figure 2:
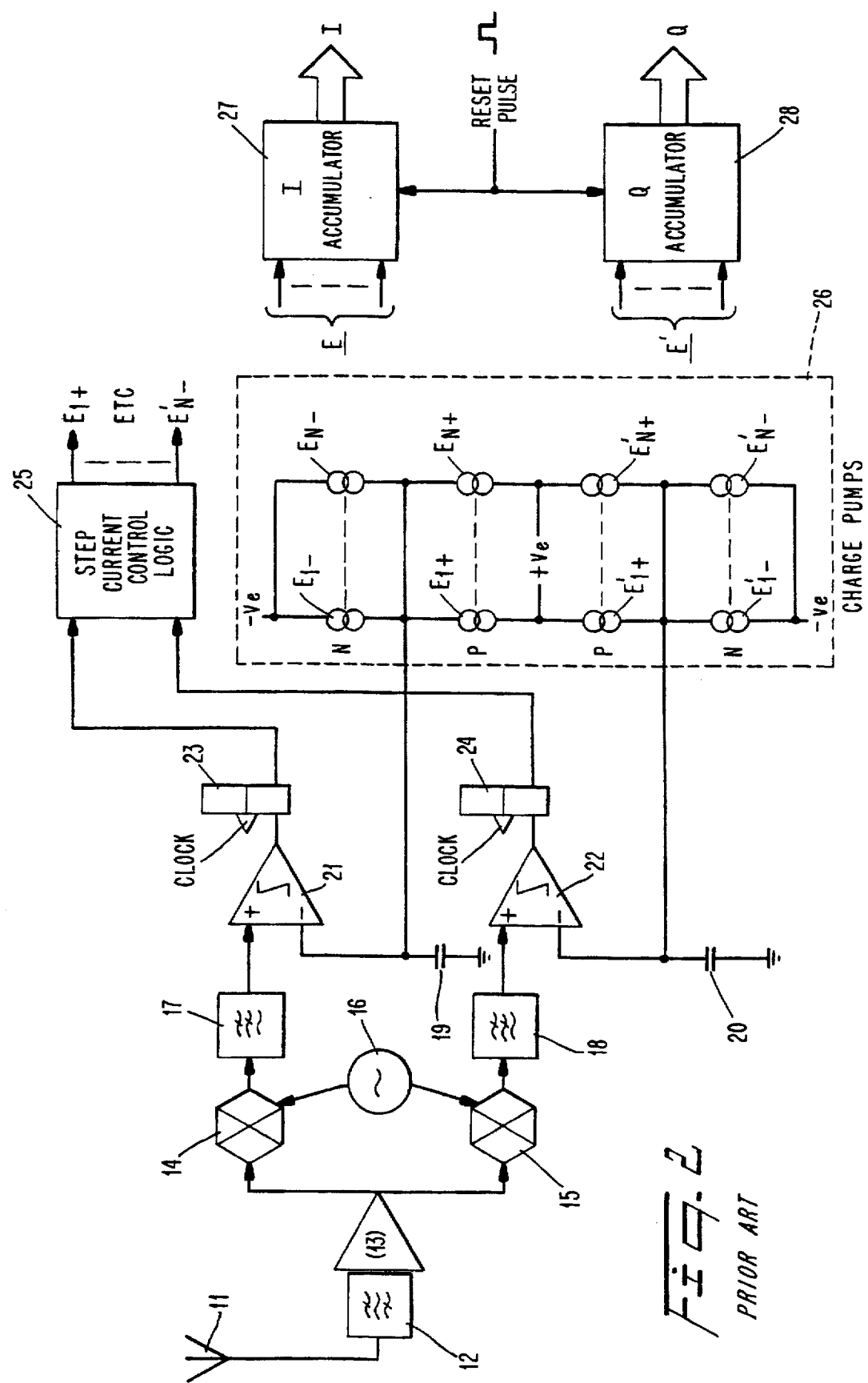
FIG. 2 illustrates a prior art homodyne receiver.

FIG. 2 illustrates a direct conversion receiver 10 according to the principles of U.S. Pat. No. 5,241,702, which is incorporated herein by reference in its entirety. An antenna 11 receives a radio signal which is filtered in a filter 12 to remove strong out-of-band interferers. The filtered signal is then amplified in a low-noise amplifier 13 and downconverted in quadrature mixers 14 and 15 against local reference oscillator 16 which is tuned nominally to the center of the channel frequency being received. The complex baseband signals from mixers 14 and 15 are low-pass filtered in channel filters 17 and 18. Low pass filtering the complex baseband signals with filters having a cutoff frequency of Fc is equivalent to bandpass filtering the radio signal with a filter bandwidth of 2Fc. One of the advantages obtained using direct conversion receivers is that such low pass filters are easier to construct than high-Q bandpass filters. The problem With homodyne receivers is that mixers 14 and 17 do not give out a zero level when no input signal is present. Instead, the mixers output static DC levels on the order of tens of millivolts. If the amplifier 13 attempts to provide a great deal of amplification to raise the wanted signal from the microvolt levels received at the antenna to a level of hundreds of millivolts needed to swamp the DC offsets, then stronger signals in other channels, which are not removed until after passing through filters 17 and 18, will be amplified to even greater levels and will saturate the amplifier 13 and mixers 14 and 15 which have limited voltage swing capability as determined by the given battery supply voltage. Moreover, when the mixer output offsets are caused by leakage from the oscillator 16 being received at antenna 11 as coherent self-interference, it does not help to increase the amplification in the amplifier 13 since this will just increase the DC offsets as well as the wanted signal without improving their ratio.

According to the principles of U.S. Pat. No. 5,241,702, the DC offset from the mixers 17 and 18 may be distinguished from the much smaller signal components by the fact that the DC offset is relatively static while the signal components are changing due to modulation with information. Therefore a means is used to digitize the changes or time derivatives of the filtered mixer output signals.

The I and Q channel signals are thus digitized preferably after differentiation to remove the static DC offset components, and this is accomplished by means of a delta-modulation convertor. The delta modulation convertor for each channel comprises a principal integrator capacitor 19 and 20 which is driven to follow the input I or Q signal by a charge or discharge current pulse from charge pumps 26. Comparators 21 and 22 compare the I and Q signals with the voltage on respective capacitors and generate a high/low indication which is registered in latches 23 and 24 at a regular clock rate and then processed in a step current control logic unit 25 to provide up/down commands to the charge pumps 26. The comparators 21 and 22 are able to sense even minute errors of microvolts between the voltage on a principal integrator capacitor applied to one input and the I or Q signal applied to the other comparator input. Thus, most of the receiver gain can be said to occur in comparators 21 and 22 which have similar technical requirements to the hardlimiting Intermediate Frequency amplifier chains used in a conventional superheterodyne receiver having a non-zero Intermediate frequency.

To provide the receiver with a high dynamic range, i.e., the ability to handle wanted signal levels ranging from the noise level to perhaps 100 dB stronger than the noise level, the delta modulation technique can incorporate variable stepsize or companding whereby the step control logic unit 25 can enable charge pumps of different current magnitudes according to the need to cause principal integrator capacitors to follow a large signal swing or a small signal swing. A typical companding principle is to decide to increase the stepsize or charge pump current if comparator 21 or 22 indicates three successive "ups" or three successive "downs," showing that the voltage on a capacitor is having difficulty keeping pace with the signal variations. The decision to increase the stepsize causes an increment to be added to a stepsize register in the logic unit 25, while no decision to increase the stepsize causes the stepsize register to be reduced using a decrement. While different increments and decrements giving different companding laws are well known and are not material to the general principal of the present invention, it is important however that companding be applied jointly to both the I and Q channel delta modulators by means of a common stepsize register so as to preserve equality of gain in the two channels.

The value momentarily residing in the stepsize register may be used to determine a corresponding current pulse value from the charge pumps 26 by, for example, constructing a series of charge pumps having current magnitudes in the binary ratios of 1, 1/2, 1/4, 1/8 . . . . and enabling each according to a corresponding binary bit in the stepsize register. Thus, if the stepsize register contained the value 100000, only the current source having the largest current value of 1 unit would be enabled, while if the register contained 01010000, then a current value of 1/2+1/8=0.625 units would be obtained. The sign of the current is determined by the sign of the comparison latched in the latch 23 for the I channel and the latch 24 for the Q channel, and causes either a P-type current source connected to the positive supply rail to be enabled to charge the associated capacitor to a higher voltage or an N-type current source connected to the -ve supply rail to be enabled to discharge the capacitor to a lower voltage. The magnitude of the charge or discharge current is however decided by the bit content of the step control register.

The capacitors 20 and 21 are thus caused to follow the I and Q waveforms respectively, consisting of a large DC offset or pedestal on top of which a small signal variation lies. The up/down series of steps of the delta modulator represents the signal changes however, and not the DC offsets which are thereby removed. Accumulators 27 and 28 receive the stepsize register values and the up/down sign sequences produced for the I,Q signals by the two-channel companded delta-modulator and add or subtract the digital step value to each accumulator according to the associated I or Q sign. The accumulators may be reset to zero at some convenient point such as at the beginning of a TDMA radio signal burst and thereafter will follow the signal I,Q waveforms with the mixer DC offsets having been removed. If when an accumulator was reset, the corresponding I or Q part of the received signal was not at that time zero, an error will be introduced which represents a DC shift or offset of the I or Q waveform, but which however cannot now be any greater than the signal level itself and so does not risk causing the digital values out of the accumulators 27 and 28 to saturate at maximum or minimum. This residual offset which represents an arbitrary constant of re-integration can be removed by using prior knowledge of the type of signal expected and estimating the error. The estimated error is then subtracted from the accumulator output values before further processing.

A preferred method of carrying out operations on the output signals from the accumulators 27 and 28 is to collect all values over some suitable signal segment, such as a TDMA burst, in a memory and then to process them retrospectively. One method of removing the arbitrary constants of re-integration could then be, for example, to compute the average value of the I samples and the Q samples over the segment, expecting it to be zero, and then to subtract the mean value from the stored I and Q values. More sophisticated methods of processing to demodulate digitally modulated information can involve Viterbi equalizers to compensate for echos or Intersymbol Interference in the propagation path or radio channel, and operate by using a training pattern of known symbols inserted periodically in the signal stream to estimate the amplitude and phase of delayed echos. Data symbol sequences of sufficient length to encompass the longest echo delay are then postulated, and using the echo estimates, a corresponding I,Q value to be expected is calculated. The error between the I,Q value received and that expected is accumulated for successive data sequence postulates that are mutually compatible and the sequence with the lowest cumulative error (path metric) is then selected as the output.

In this process, it is also possible to use the known training pattern to estimate the constants of integration as well as the echos, and the estimated constants of integration are simply added to the I,Q predictions made using the echo estimates and a data sequence postulate to predict the I,Q value that should be received including said constant offsets. The constant offsets of reintegration are thereby prevented from contributing to the cumulative path metric of the Viterbi equalizer and thus do not cause an error in the determination of the most likely data symbol sequence.

In the receiver illustrated in FIG. 2, the digital output values from I,Q accumulators 27 and 28 correspond to the voltage values on the capacitors 19 and 20 which are caused to follow the I,Q signals. The capacitors perform an analog integration of successive up/down current pulses of a given step magnitude while the accumulators perform a digital integration of the same step magnitude given by the stepsize register of control logic unit 25. It is, however, practically impossible to achieve exact correspondence between the currents generated by charge pumps 26 and the stepsize register values. There are known differences in the physics of P-type and N-type field effect transistors and between NPN and PNP bipolar transistors that make it difficult to obtain a negative current source of exactly the same magnitude as the associated positive current source. Thus, when a positive current source is enabled and a corresponding stepsize register value V is added to an accumulator, followed by a negative current source being enabled and the value V is subtracted from the accumulator, the accumulator value will return to exactly the original value while the corresponding capacitor voltage will not, owing to the small difference between the charge and discharge currents. Thus, after a train of up/down commands, the capacitor voltage and the accumulator voltage will diverge. The negative feedback inherent in the delta modulation process forces the capacitor to follow the input signal, but the accumulator value will diverge by an increasing amount per up/down pair and thus exhibit a slope error which could eventually cause overflow. This problem of divergence between the accumulator values and the true I,Q values is solved by the present invention.

Figure 3:
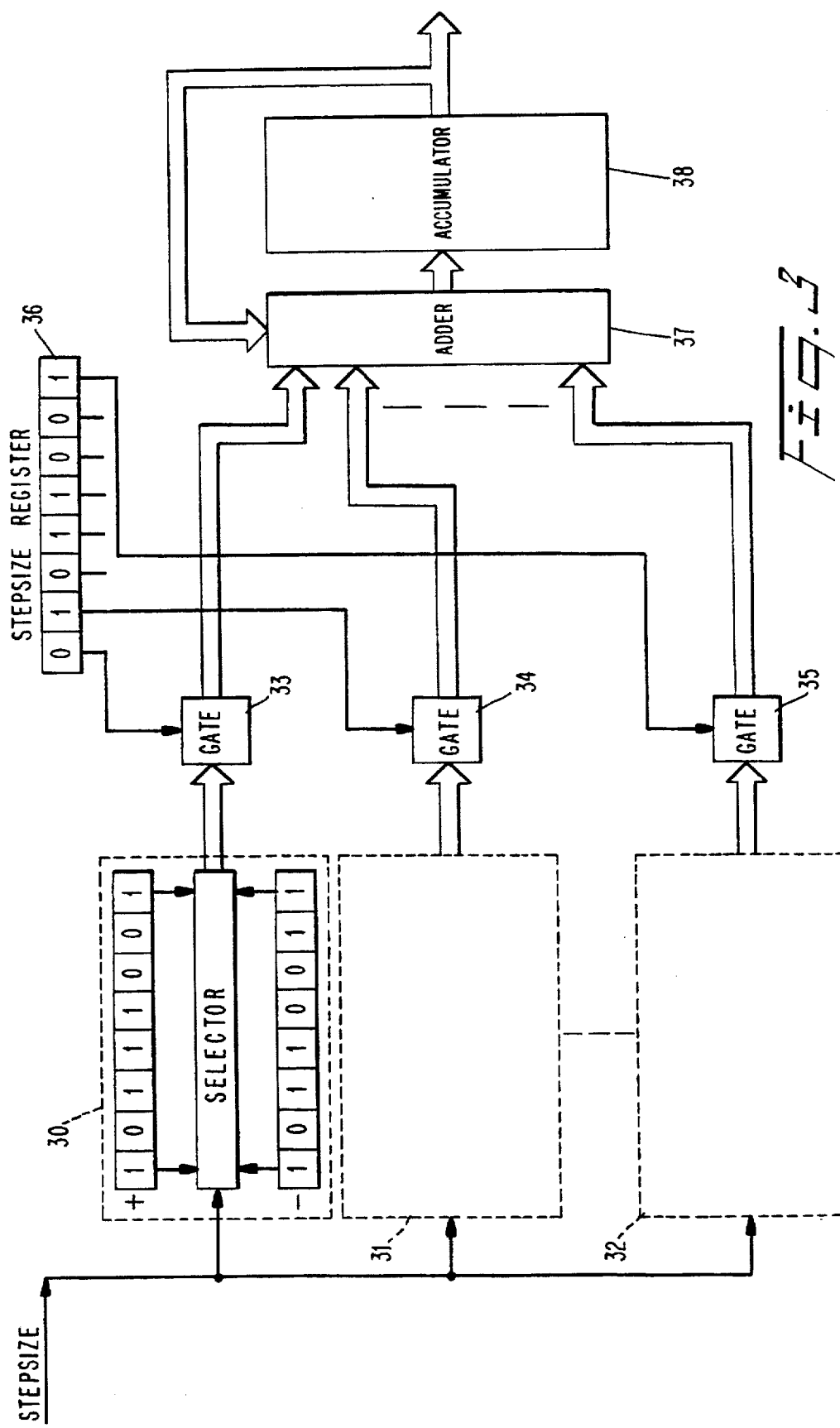
FIG. 3 illustrates slope error compensation in an A-to-D convertor according to one embodiment of the present invention.

One embodiment of the present invention comprises inclusion of slope error compensation within the delta-modulation AtoD conversion process and more specifically within the digital re-integration process. FIG. 3 illustrates one method of compensating slope errors according to the present invention. A number of selector gates 23,31, . . . 32 are connected to select between a first value (considered a positive value) and a second value (considered a negative value) according to whether the sign of the up/down step determined by the delta-modulator's comparator is + (up) or − (down). Each pair of positive and negative values is stored in a corresponding pair of registers or memory positions. A person skilled in the art will appreciate that the arrangement of registers and selectors 30,31, . . . 32 can be conveniently implemented in an integrated circuit by means of a small Random Access memory or Electronically Erasable and Programmable Read Only Memory (E2PROM) with appropriate addressing arrangements.

Each register pair and associated selector corresponds to a particular bit in the stepsize register. In the prior art, a bit in the stepsize register indicated a current magnitude according to its significance, the bits being always in the series 1, 1/2, 1/4, 1/8 . . . . relative to each other. The sign of the current was indicated by the stepsign bit, so the magnitude indicated by a particular stepsize bit was the same regardless of sign. The actual positive and negative current sources cannot be perfectly matched, thus giving rise to the slope error. In the arrangement illustrated in FIG. 3, the magnitudes stored in the register pairs are independent for the positive and negative stepsign. Moreover, the values associated with different stepsize register bits are not constrained to bear a power of two relationship to each other. Rather, each register may be programmed with a value representing the actual current of the positive or negative current source that is enabled by a particular bit of the stepsize register. Thus, when a current source or combination of current sources is enabled to increase or decrease the charge on the principal integrator capacitor, the accumulator 38 will be increased or decreased with an exact corresponding value. This occurs through each bit that is equal to a binary "1" in a stepsize register 36 enabling an associated gate 33,34, . . . 35 to pass a selected one of the register values from selector 30,31, . . . 32 through to an adder 37. Thus, the digital values selected to be added in the adder 37 to the accumulator 38 correspond to the analog current source values that are enabled by stepsize register 36 and the stepsign bit to sum into the principal integrator capacitor. Thus, the accumulator value will follow more accurately the voltage changes on the principal integrator capacitor that in turn follow the wanted signal component. The accuracy is optimized by programming values into register/selector circuits 30,31, . . . 32 that accurately represent the relative current values of the positive and negative current sources. This could, for example, be carded out at the production stage by means of a calibration procedure in which each current source was enabled in turn, its current value measured, and a corresponding digital value stored in memory. A non-volatile memory such as E2PROM is normally provided attached to the device's main control microprocessor for storing such factory calibration values. The stored values can later be recalled (on power-up, for example) and downloaded into registers 30,31, . . . 32.

It is also possible to learn the correct contents of registers 30,31 . . . . 32 during operation. After decoding a signal segment and determining its information content, the deviation of the received signal waveform from the waveform that would be expected for that information content can be determined inside the digital signal processor. The deviation is expressed as a mean slope or drift over the signal segment of the I and Q waveforms respectively. It is helpful if in addition the number of times each current source was enabled to generate a positive current and the number of times it generated a negative current are determined by logic unit 25 incorporating the inventive arrangement of FIG. 3. Denoting the number of times each current source $I_i$ is activated by $N_i$, then the following equation should hold:

$$N1 \cdot I1 + N2 \cdot I2 \ldots + Nm \cdot Im = \text{difference in signal voltage between beginning and end of burst.}$$

This may not be solvable to separate the values of $I_i$ after processing only one signal segment, but after processing approximately m signal segments there are enough equations to solve. In practice, the Kalman sequential least squares process is the preferred approach for updating the calibration of the $I_i$ values. The Kalman procedure is a method for solving in the least squares sense all equations collected to date, but in an efficient manner that expresses the changes from the previous best solution in terms of the most recently acquired equation coefficients. Thus, the calibration of the $I_i$ values can be updated by the Kalman process after processing each signal segment.

It may not be necessary to execute the Kalman procedure so often, as the calibration of hardware-related parameters is not expected to change rapidly. It is possible to accumulate a number of the above equations into groups having similar $N_i$ values and then to process the accumulated groups only occasionally, in order to conserve processor power. For example, if all the equations having N1 as the largest coefficient are summed into a group 1, the sum of the N1 coefficients will increasingly come to dominate over the sums of the others. Likewise, if all the equations having N2 as the largest coefficient are summed into a group 2, then the sum of the N2 coefficients will come to dominate. The accumulation of equations into m groups in this way will give a cumulative equation set that tends more to have a diagonal coefficient matrix, such being the most well-conditioned for solution either directly or by the sequential Kalman technique.

An alternative technique for slope compensation is illustrated in FIG. 4. FIG. 4 illustrates a pair of I and Q waveforms that are represented by a sequence of complex number samples after the digitization process. Initially, it is assumed the I and Q accumulators were set to zero just before information bearing signal samples were received. Since it could not be known if the received signal plus noise was indeed zero at the reset instant, the error known as the arbitrary constant of reintegration is introduced, which however is now of magnitude no greater than the wanted signal changes. FIG. 4 illustrates I,Q waveforms having both this constant offset and a systematic slope. The offsets and slopes are independent for the I and Q waveforms and have to be separately determined. One simple method is to simply fit the best straight line to the digitized value sequence of the form Y=aX+b. Curve fitting techniques are well known in the art. The result of fitting a straight line in the least squares sense to the I or Q sequence is to yield a value $a_I$ for the slope of the I waveform, $b_I$ for the constant offset of the I waveform and corresponding values for the Q waveform. Then, the slope and offsets are subtracted from the I and Q waveforms prior to further processing. This simple procedure can suffice in the case where signal segments are relatively long such that information modulation averages to zero over the segment and does not cause significant inaccuracy in the determination of the slope and offset. In the case where this is not so, the initial estimates of offset and slope can be refined during the decoding of digital information which may represent a digitized voice signal as the information waveform becomes known and can be subtracted from the determination of slope and offset. For decoding digital information by means of a Viterbi equalizer, the refining can be performed successively after processing each I,Q sample preferably by the technique known as "Kalman per Viterbi state" as described in U.S. Pat. No. 5,136,616 for updating frequency error estimates, in U.S. Pat. No. 5,204,878 for channel estimates and in U.S. patent application No. 08/305,651 entitled "Fast Automatic Gain Control" in regard to channel gain estimates. These patents and applications are incorporated by reference herein.

In "per-state Kalman", a Viterbi sequential maximum likelihood sequence estimation procedure for decoding data sequences maintains a number of as-yet unresolved data sequence hypotheses. Associated with each hypothesis of the data sequence to date, an estimate of the slope and offsets of the I,Q waveforms can be made with the effect of the hypothesized data sequence removed. For each state, a path metric is computed according to known Viterbi techniques and indicates the likelihood of the associated data sequence hypothesis being correct. The collection of parameters associated with each data sequence hypothesis is known as a "State Memory". The offset and slope stored in a particular state is used to predict the next I,Q value first on the assumption that the next data bit is a 0 and then on the assumption that it is a binary 1. The mismatch between the predicted and actual I,Q values is computed and added to the cumulative path metric to obtain new path metrics. In this way, the number of states is first doubled, but then may be halved by selecting to retain only the best of the pairs of states agreeing in all but their oldest bits. The retained states comprise data sequence hypotheses that have been extended by one data symbol, and the estimates of the slope and offset in each state may now be updated on the assumption that the new symbol that has just been added to each extended data sequence is true. Finally, the state having the lowest path metric is selected to give the decoded data sequence that is most likely to be true, and the associated I,Q slopes and offsets are the best estimates of same with that data sequence having been specifically accounted for. The slope errors may be used then, for example, to correct the AtoD conversion process by the means shown in FIG. 3, or by simpler means such as adjusting the relative values of positive and negative current sources by feeding back a control signal. It will be understood by those skilled in the art that the digital information can be modulated onto the radio input signal using a variety of techniques. For example, the digital information can be modulated using manchester-code frequency modulation, Gaussian Minimum Shift Keying, DQPSK and Pi/4-DQPSK.

The improvement to zero-IF receivers described above and comprising correction of both offset and slope compensation of I,Q waveforms is not meant to be limiting but rather exemplary, and a person skilled in the art will be able to suggest other means of implementing slope compensation that nevertheless are considered to fall within the spirit of the invention as set out in the following claims. The scope of the invention is indicated by the appended claims rather than the foregoing description, and all changes which come within the meaning and range of equivalents thereof are intended to be embraced therein.

We claim:

1. An analog-to-digital conversion technique, comprising the steps of:

comparing an input signal voltage with a feedback voltage and generating a high/low indication at a regular repetition rate determined by a clock pulse train;

integrating a controlled current to generate said feedback voltage;

producing said controlled current controlled in magnitude by a stepsize controller and in direction or sign in accordance with said high/low indication;

controlling said current magnitude in dependence on historical values of said high/low indications and producing a digital stepsize value indicative of the current magnitude generated for a positive-direction of current flow and a negative direction of current flow respectively; and adding or subtracting said digital stepsize value to produce a series of accumulated digital values representative of said input signal voltage waveform.

2. An analog-to-digital conversion technique according to claim 1, further comprising the step of:

determining said digital stepsize values that are most accurately representative of a positive current and a negative current respectively.

3. An analog-to-digital conversion technique according to claim 1, wherein said current magnitude is independent for positive and negative stepsign.

4. An analog-to-digital conversion technique according to claim 1, wherein said current magnitude is the actual current magnitude.

\* \* \* \* \*